(12) United States Patent
Guo et al.

(10) Patent No.: US 12,349,400 B2
(45) Date of Patent: Jul. 1, 2025

(54) EDGE TERMINATION STRUCTURE FOR POWER TRANSISTOR DEVICES

(71) Applicant: Infineon Technologies Austria AG, Villach (AT)

(72) Inventors: Lina Guo, Laguna Niguel, CA (US); Oliver Blank, Villach (AT); Timothy Henson, Mount Shasta, CA (US); Laszlo Juhasz, Villach (AT)

(73) Assignee: Infineon Technologies Austria AG, Villach (AT)

( * ) Notice: Subject to any disclaimer, the term of this patent is extended or adjusted under 35 U.S.C. 154(b) by 602 days.

(21) Appl. No.: 17/497,238

(22) Filed: Oct. 8, 2021

(65) Prior Publication Data

US 2023/0116123 A1    Apr. 13, 2023

(51) Int. Cl.
*H10D 30/66*    (2025.01)
*H10D 64/00*    (2025.01)

(52) U.S. Cl.
CPC ......... *H10D 30/665* (2025.01); *H10D 30/668* (2025.01); *H10D 64/117* (2025.01)

(58) Field of Classification Search
CPC ............. H01L 29/7811; H01L 29/7813; H01L 29/407; H01L 29/404
See application file for complete search history.

(56) References Cited

U.S. PATENT DOCUMENTS

| | | | |
|---|---|---|---|
| 2014/0264569 A1* | 9/2014 | Yedinak | H01L 21/02104 257/330 |
| 2016/0064548 A1* | 3/2016 | Laforet | H01L 29/66734 257/331 |
| 2016/0293714 A1* | 10/2016 | Hutzler | H01L 29/0615 |
| 2017/0229572 A1* | 8/2017 | Nagase | H01L 29/404 |
| 2017/0250255 A1* | 8/2017 | Siemieniec | H01L 29/407 |
| 2020/0091338 A1* | 3/2020 | Nishiwaki | H01L 29/7813 |
| 2020/0388671 A1* | 12/2020 | Takemoto | H01L 29/66734 |

* cited by examiner

*Primary Examiner* — Samuel A Gebremariam
*Assistant Examiner* — Jonas T Beardsley
(74) *Attorney, Agent, or Firm* — Murphy, Bilak & Homiller, PLLC (57) ABSTRACT

A semiconductor device is described. The semiconductor device includes: a semiconductor substrate having an edge, an active area spaced inward from the edge, and an edge termination area laterally surrounding the active area; and a plurality of transistor cells formed in the active area, each transistor cell including a source region of a first conductivity type and a body region of a second conductivity type opposite the first conductivity type. The edge termination area includes a plurality of needle-shaped compensation trenches and is devoid of complete transistor cells. A body doping region of the second conductivity type and that includes the body regions of the transistor cells extends from the active area into the edge termination area. The body doping region in the edge termination area is physically and electrically isolated from the body doping region in the active area.

21 Claims, 9 Drawing Sheets

FIG. 8

EDGE TERMINATION STRUCTURE FOR POWER TRANSISTOR DEVICES

BACKGROUND

Medium voltage (60 to 300V) power MOSFET (metal-oxide-semiconductor field-effect transistor) devices have an edge termination region for lateral blocking of the breakdown voltage in a direction of the diced edge of the die (chip). Conventional edge termination designs have two high impact ionization areas which create breakdown hotspots. One high impact ionization area is at the end of the body doping region. The other high impact ionization area is at a first floating/last grounded field plate trench in the edge termination region. However, the device breakdown voltage may be increased by reducing the surface electrical field in the edge termination region and moving the breakdown hotspot inward to the active area of the device.

Thus, there is a need for an improved edge termination structure for power transistor devices.

SUMMARY

According to an embodiment of a semiconductor device, the semiconductor device comprises: a semiconductor substrate having an edge, an active area spaced inward from the edge, and an edge termination area laterally surrounding the active area; and a plurality of transistor cells formed in the active area, each transistor cell comprising a source region of a first conductivity type and a body region of a second conductivity type opposite the first conductivity type, wherein the edge termination area comprises a plurality of needle-shaped compensation trenches and is devoid of complete transistor cells, wherein a body doping region of the second conductivity type and that includes the body regions of the transistor cells extends from the active area into the edge termination area, wherein the body doping region in the edge termination area is physically and electrically isolated from the body doping region in the active area.

According to another embodiment of a semiconductor device, the semiconductor device comprises: a semiconductor substrate having an edge, an active area spaced inward from the edge, and an edge termination area laterally surrounding the active area; and a plurality of transistor cells formed in the active area, each transistor cell comprising a source region of a first conductivity type and a body region of a second conductivity type opposite the first conductivity type, wherein the edge termination area comprises a plurality of needle-shaped compensation trenches and is devoid of complete transistor cells, wherein a body doping region of the second conductivity type and that includes the body regions of the transistor cells extends from the active area into the edge termination area, wherein the edge termination area comprises a doping region of the first conductivity type extending from the body doping region to the edge of the semiconductor substrate, wherein at least one of the needle-shaped compensation trenches is formed in the doping region of the first conductivity type and has a field plate that is electrically floating.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1C illustrate partial views of an embodiment of a semiconductor device that includes an edge termination structure, where

FIGS. 2A through 2C illustrate partial views of another embodiment of a semiconductor device that includes an edge termination structure, where

DETAILED DESCRIPTION

The embodiments described herein provide an edge termination structure for power transistor devices that reduces the surface electrical field in the edge termination region and moves the breakdown hotspot inward to the active area of the device, thereby increasing the device breakdown voltage by 5V over more compared to similar power transistor devices with a conventional edge termination design. In one embodiment, the body doping region in the edge termination area is physically and electrically isolated from the body doping region in the active area. In another embodiment, the edge termination area includes a doping region of the opposite conductivity type as the body region which extends from the body doping region to the edge of the semiconductor substrate, and at least one of the needle-shaped compensation trenches formed in this doping region and having a field plate that is electrically floating where 'electrically floating' means not connected to an electric potential. These embodiments may be combined or implemented independently.

Described next with reference to the figures are embodiments of the edge termination structure.

Figure 1A:
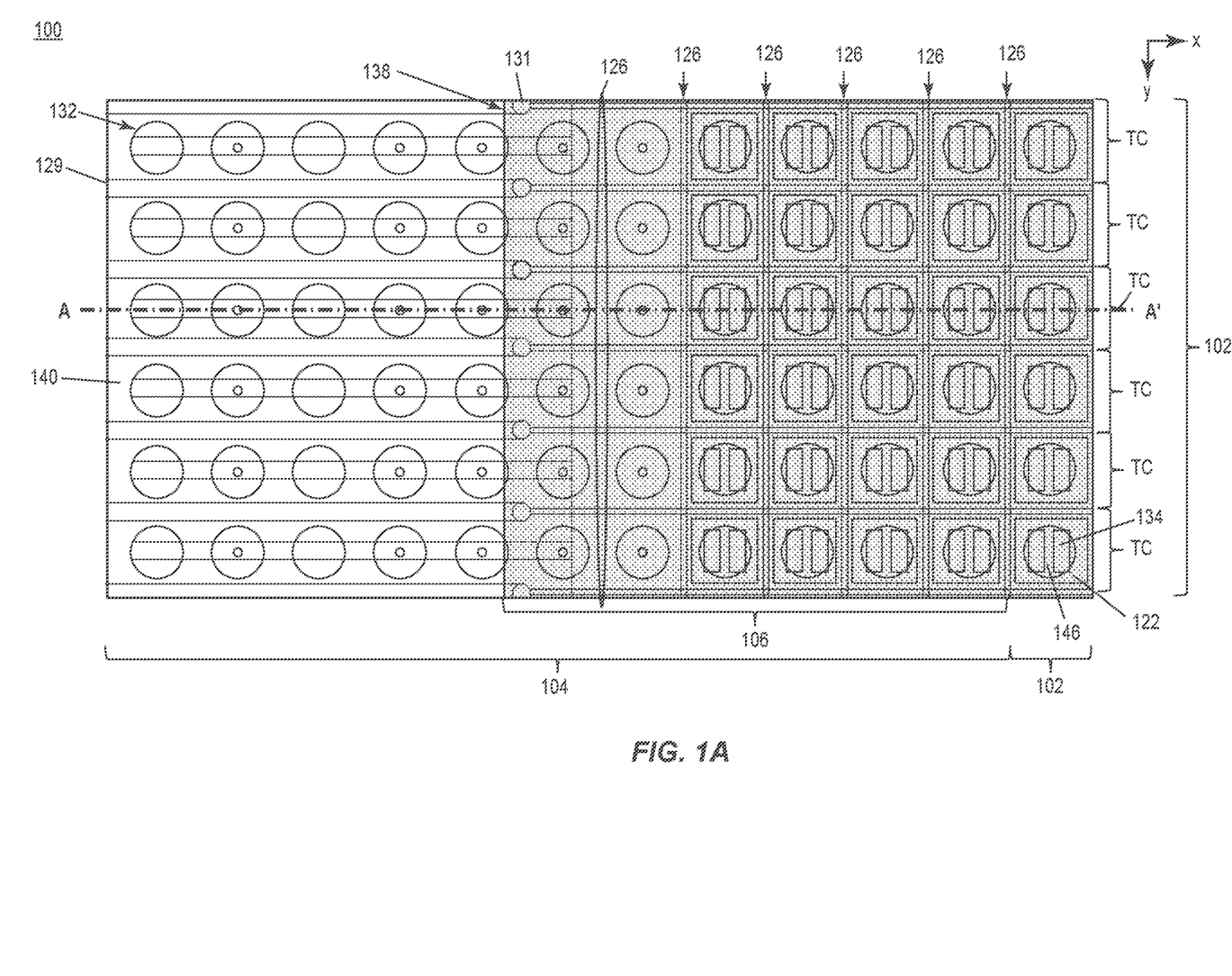
FIG. 1A is a partial top plan view of the semiconductor device in a region where an active area of the device adjoins an edge termination area of the device.
Figure 1B:
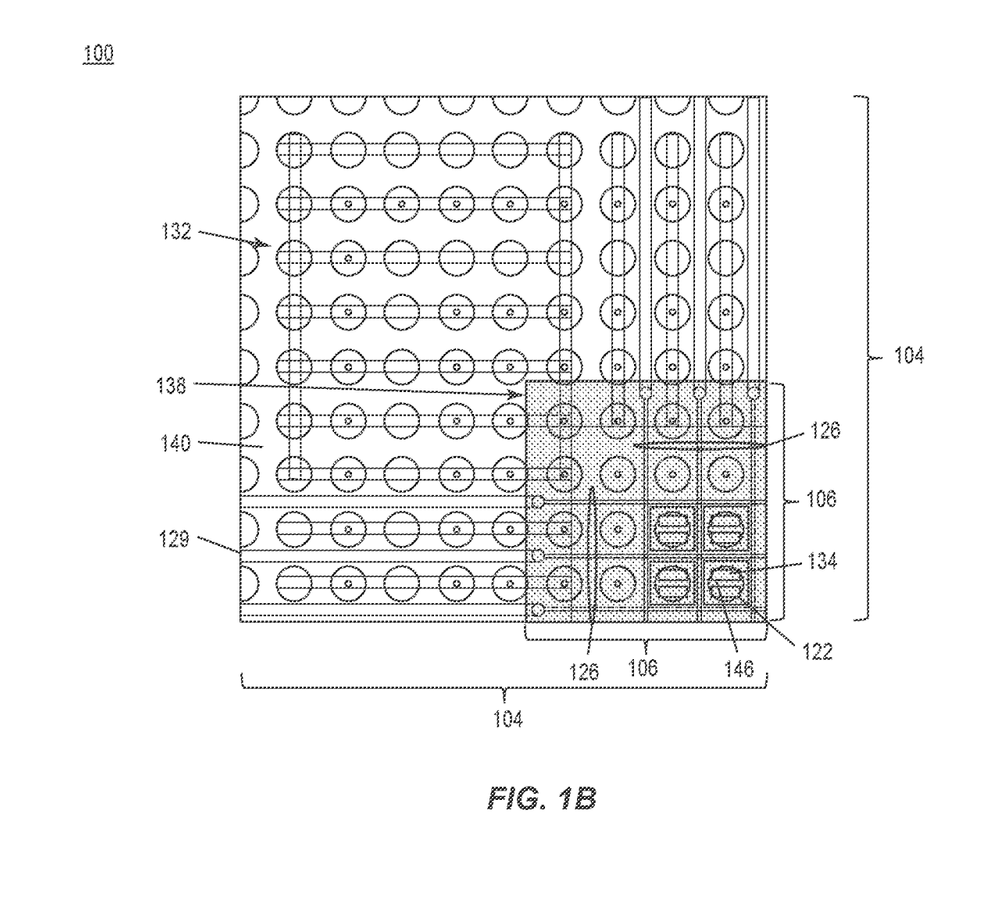
FIG. 1B shows a transition zone of the edge termination area in a corner region of the edge termination area.
Figure 1C:
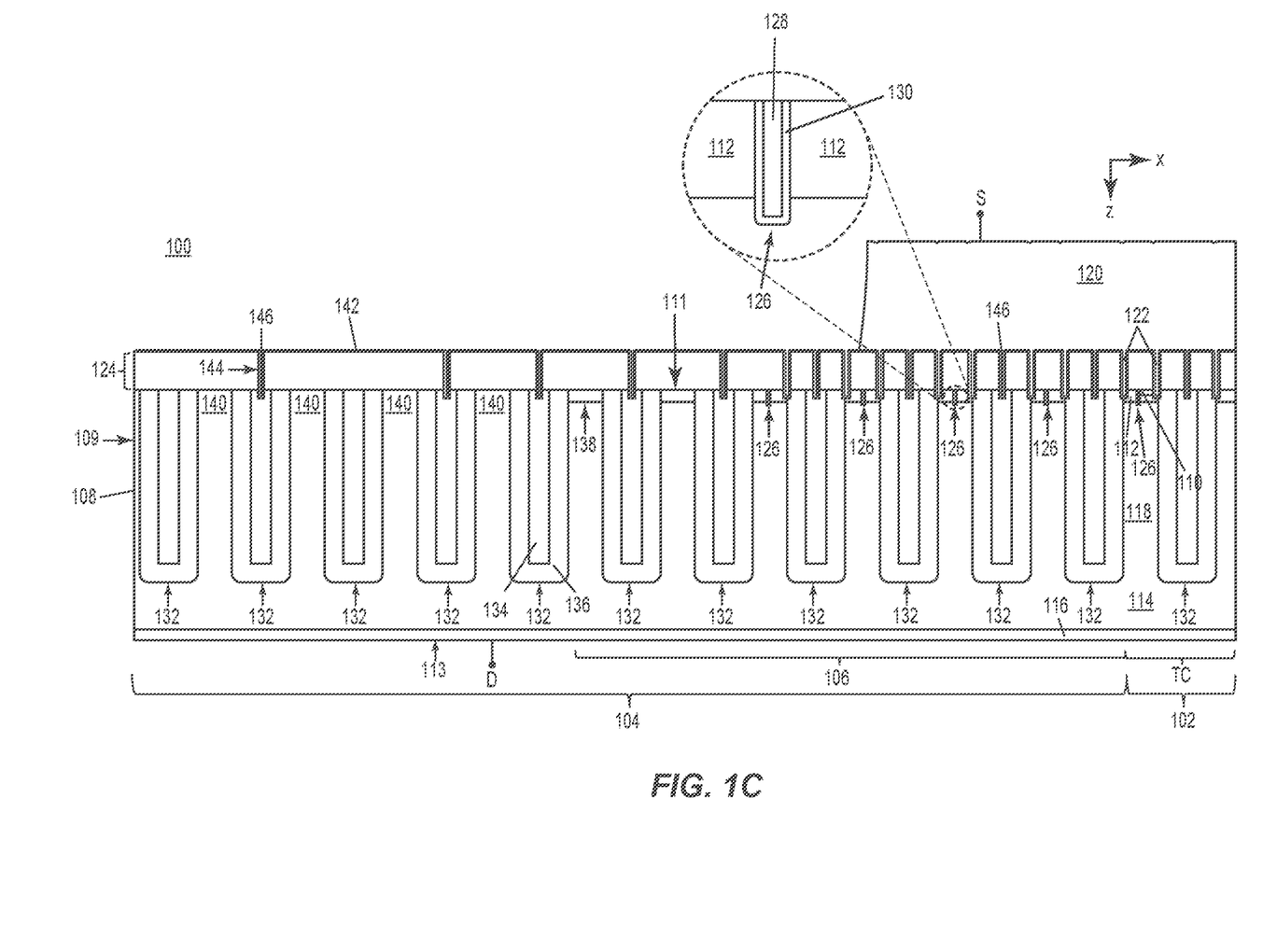
FIG. 1C is a cross-sectional view along the line labelled A-A' in FIG. 1A.

FIGS. 1A through 1C illustrate partial views of an embodiment of a semiconductor device 100 that includes the edge termination structure. FIG. 1A is a partial top plan view of the semiconductor device 100 in a region where an active area 102 of the device 100 adjoins an edge termination area 104 of the device 100. FIG. 1B shows a transition zone 106 of the edge termination area 104 in a corner region of the edge termination area 104. FIG. 10 is a cross-sectional view along the line labelled A-A' in FIG. 1A.

The semiconductor device 100 may be a low voltage power MOSFET having a maximum rated voltage of 60V or below. The semiconductor device 100 instead may be a medium voltage power MOSFET having a maximum rated voltage between 60V and 300V, or a high voltage power MOSFET having a maximum rated voltage greater than 300V. Other device types may utilize the edge termination teachings described herein.

In each case, the active area 102 and the edge termination area 104 are formed in a semiconductor substrate 108 having an edge 109 which delimits the semiconductor substrate 108. The active area 102 is spaced inward from the edge 109 and the edge termination area 104 laterally surrounds the active area 102. The semiconductor substrate 108 comprises one or more semiconductor materials that are used to form power semiconductor devices such as Si or SiC power MOSFETs. For example, the semiconductor substrate 108 may comprise Si, silicon carbide (SiC), germanium (Ge), silicon germanium (SiGe), gallium nitride (GaN), gallium arsenide (GaAs), and the like. The semiconductor substrate 108 may be a bulk semiconductor material or may include one or more epitaxial layers grown on a bulk semiconductor material.

Transistor cells 'TO' are formed in the active area 102 and electrically coupled in parallel to form a power transistor such as a Si or SiC power MOSFET. Each transistor cell TC includes a source region 110 of a first conductivity type and a body region 112 of a second conductivity type opposite the first conductivity type. The source region 110 of each transistor cell TC is separated from a drift zone 114 of the first conductivity type by the body region 112. In the case of a Si or SiC power MOSFET, a drain region 116 adjoins the drift zone 114 at a second main surface 113 of the semiconductor substrate 108.

The first conductivity is n-type and the second conductivity type is p-type for an n-channel device whereas the first conductivity is p-type and the second conductivity type is n-type for a p-channel device. For either n-channel or p-channel devices, the source region 110 and the body region 112 included in the same semiconductor mesa 118 form part of a transistor cell TC and the transistor cells TC are electrically connected in parallel between source (S) and drain (D) terminals of the semiconductor device 100 to form a power transistor.

The body regions 112 may include a body contact region (not shown) of the second conductivity type and having a higher doping concentration than the body regions 112, to provide an ohmic connection with a source metallization 120 through contacts or vias 122 that extend through an interlayer dielectric 124 that separates the source metallization 120 from the underlying semiconductor substrate 108. The source regions 110 are also electrically connected to the source metallization 120 through the contacts/vias 122.

Stripe-shaped gate trenches 126 extend from a first main surface 111 of the semiconductor substrate 108 and into the substrate 108. The gate trenches 126 are 'stripe-shaped' in that the gate trenches 126 have a longest linear dimension in a direction (x or y direction in FIGS. 1A and 1B) parallel to the first main surface 111 of the semiconductor substrate 108 and transverse to the depth-wise direction (z direction in FIG. 10) of the semiconductor substrate 100. The gate trenches 126 delimit the semiconductor mesas 118 in the active area 102 of the device 100. Gate trenches 126 may be present in the transition zone 106 of the edge termination area 104.

Each gate trench 126 contains an electrode structure that includes a gate electrode 128 disposed in the gate trench 126 and a gate dielectric insulating material 130 that separates the gate electrode 128 from the surrounding semiconductor substrate 108. At least in the active area 102 of the semiconductor device 100, the gate electrodes 128 are electrically connected to a gate terminal (not shown) of the device 100 through metal gate runners 129 and respective contacts/vias 131 that extend through the interlayer dielectric 124. The interlayer dielectric 124, metal gate runners 129 and source metallization are each shown as transparent in FIGS. 1A and 1B to emphasize the underlying features.

Needle-shaped compensation trenches 132 that are separate from the gate trenches 126 are formed in the active area 102 of the semiconductor device 100 between the gate trenches 120. 'Needle-shaped' trenches are trenches that are narrow and long in a depth-wise direction (z direction in FIG. 10) of the semiconductor substrate 108. The needle-shaped compensation trenches 132 extend from the first main surface 111 of the semiconductor substrate 108 and into the substrate 108, and may resemble a needle, column or spicule in the depth-wise direction of the semiconductor substrate 108. The needle-shaped compensation trenches 132 help optimize the area-specific on-state resistance achievable for a given breakdown voltage, by providing charge carrier compensation.

A field plate 134 disposed in each needle-shaped compensation trench 132 is separated from the surrounding semiconductor substrate 108 by a field dielectric insulating material 136. The gate electrodes 128 and the field plates 134 may be made from any suitable electrically conductive material such as but not limited to polysilicon, metal (e.g., tungsten), metal alloy, etc. The gate electrodes 128 and the field plates 134 may comprise the same or different electrically conductive material. The gate dielectric insulating material 130 and the field dielectric insulating material 136 may comprise the same or different electrically insulative material, e.g., SiOx and may be formed by one or more common processes such as but not limited to thermal oxidation and/or deposition.

Regardless of the type of power transistor implemented by the transistor cells TC, and according to the embodiment illustrated in FIGS. 1A through 1C, the edge termination area 104 of the semiconductor device 100 also includes needle-shaped compensation trenches 132. The needle-shaped compensation trenches 132 included in the edge termination area 104 may have the same or different construction and/or the same or different spacing as the needle-shaped compensation trenches 132 included in the active area 102.

Unlike the active area 102 of the semiconductor device 100, the edge termination area 104 is devoid of (i.e., does not contain) complete transistor cells. That is, any transistor cells included in the edge termination area 104 are missing one or more components or regions required to make the cells fully functional. As such, any incomplete transistor cells in the edge termination area 104 do not contribute to the main current flow of the power transistor. For example, in FIG. 1C, incomplete transistor cells included in the transition zone 106 of the edge termination area 104 are missing the source regions 110.

A body doping region 138 of the second conductivity type and that includes the body regions 112 of the transistor cells TC extends from the active area 102 of the semiconductor device 100 into the edge termination area 104 of the device 100. The body doping region 138 in the edge termination area 104 is physically and electrically isolated from the body doping region 138 in the active area 102.

In one embodiment of electrically isolating the body doping region 138 in the edge termination area 104 from the body doping region 138 in the active area 102, in the active area 102, the body doping region 138 is electrically connected to the source metallization 120 through the contacts/vias 122, and in the edge termination area 104, the body doping region 138 is electrically floating. For example, as shown in FIG. 1C, the body doping region 138 is electrically disconnected from the source metallization 120 in the outer part of the edge termination transition zone 106. The body doping region 138 may be electrically floating this way by omitting the contacts/vias 122 (e.g., by masking) in the outer part of the edge termination transition zone 106.

In one embodiment of physically isolating the body doping region 138 in the edge termination area 104 from the body doping region 138 in the active area 102, the gate trenches 126 running lengthwise in the x direction and the gate trenches 126 running lengthwise in the y direction intersect one another. In the transition zone 106 of the edge termination area 104, the outermost intersecting gate trenches 126 extend deeper into the semiconductor substrate 108 than the body doping region 138, e.g., as shown in FIG. 1B for one corner region of the edge termination transition zone 106. Accordingly, the interesting gate trenches 126 physically isolate the body doping region 138 in the edge termination area 104 from the body doping region 138 in the active area 102.

Separately or in combination with physically and electrically isolating the body doping region 138 in the edge termination area 104 from the body doping region 138 in the active area 102, the edge termination area 104 may include a doping region 140 of the first conductivity type extending from the body doping region 138 to the edge 109 of the semiconductor substrate 108. At least one needle-shaped compensation trench 132 is formed in the doping region 140 of the first conductivity type and has a field plate 134 that is electrically floating. For example, in FIG. 1C, an electrically conductive liner 142 such as Ta, TaN, WN, TiN, etc. may form part of contacts or vias 144 that extend through the interlayer dielectric 124 and to or into the field plates 134 in the active area 102 of the semiconductor device 100. The remainder of the field plate contacts/vias 144 may be formed from the material of the source metallization 120, e.g., by a metal deposition process. The same electrically conductive liner 142 may be used to form part of the source and body region contacts/vias 122. Openings 144 in the interlayer dielectric 124 for forming the field plate contacts/vias 146 may be omitted (e.g., by masking) for one or more of the needle-shaped compensation trenches 132 in the edge termination area 104 of the semiconductor device 100. Accordingly, each needle-shaped compensation trench 132 in the edge termination area 104 without a corresponding source metallization contact/via 146 has a field plate 134 that is not electrically connected to the source metallization 120 but instead is electrically floating.

Figure 2A:
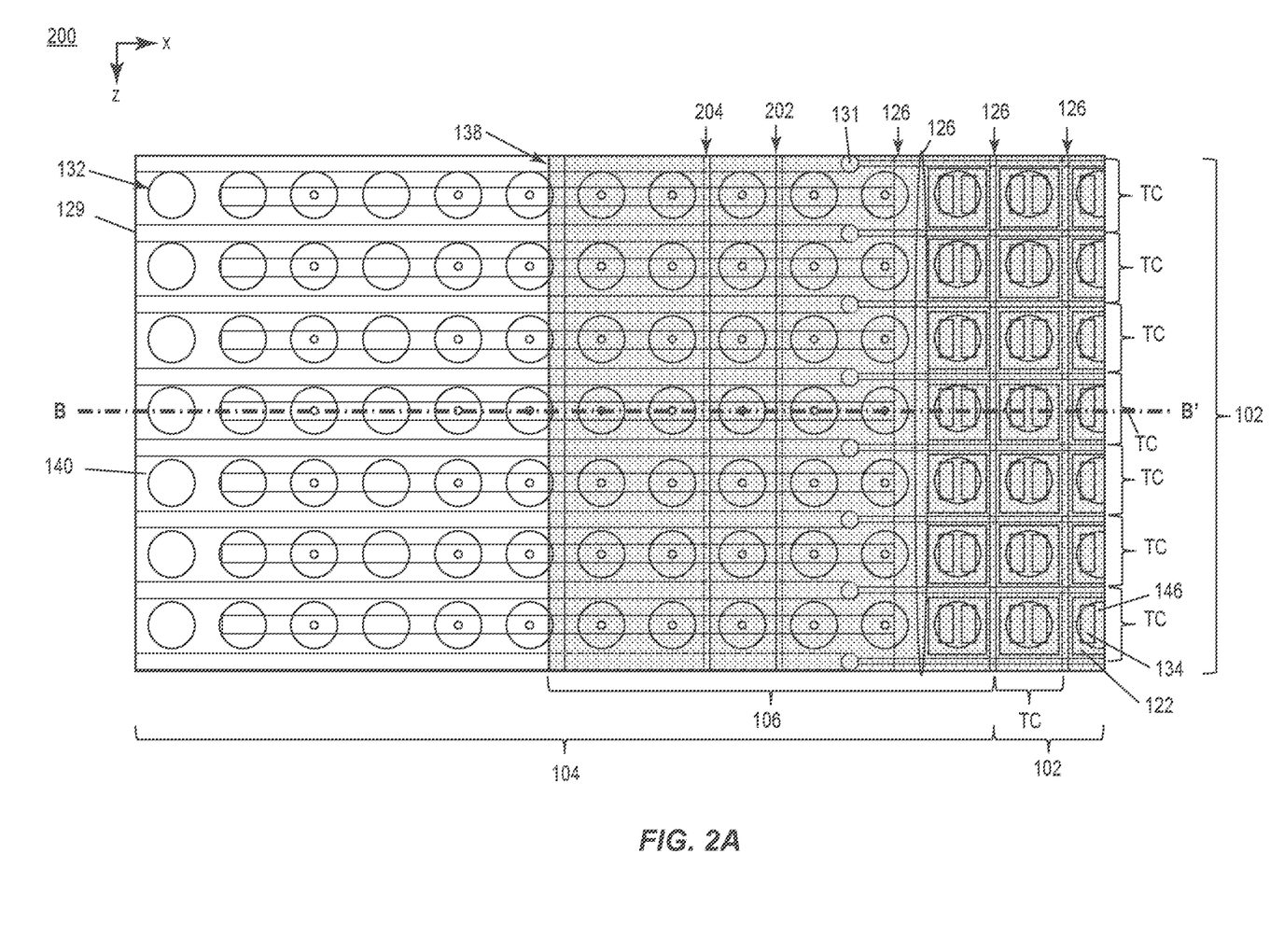
FIG. 2A is a partial top plan view of the semiconductor device in a region where an active area of the device adjoins an edge termination area of the device.
Figure 2B:
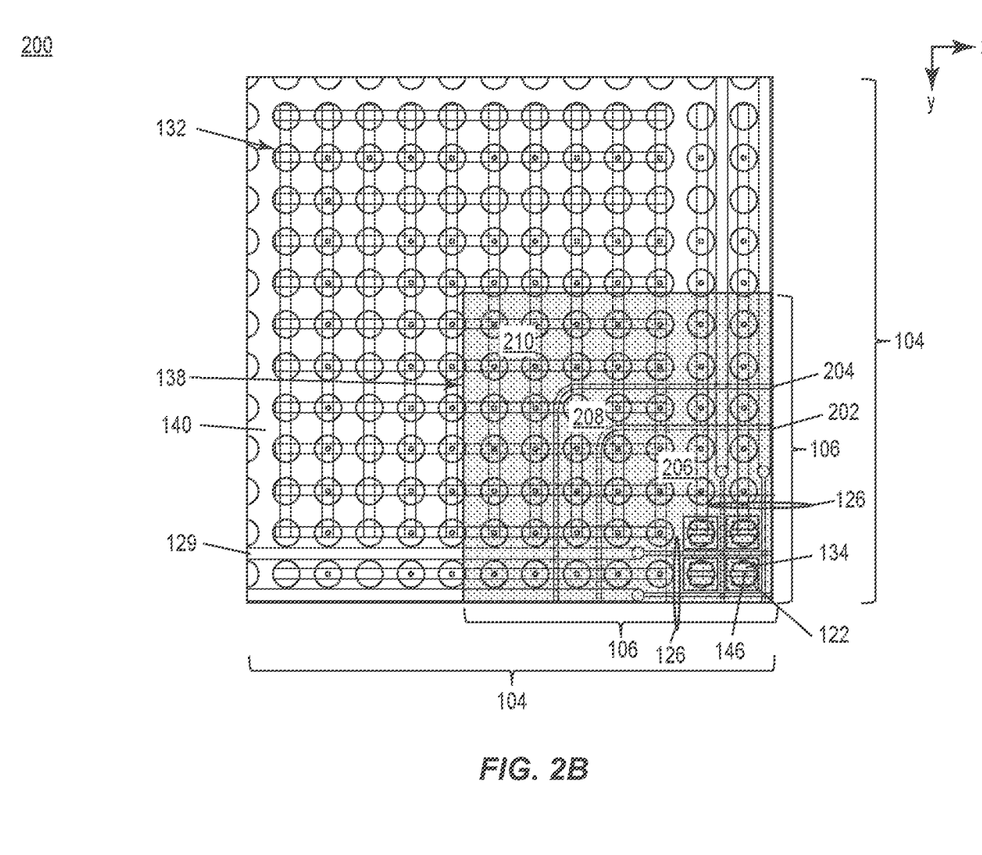
FIG. 2B shows a transition zone of the edge termination area in a corner region of the edge termination area.
Figure 2C:
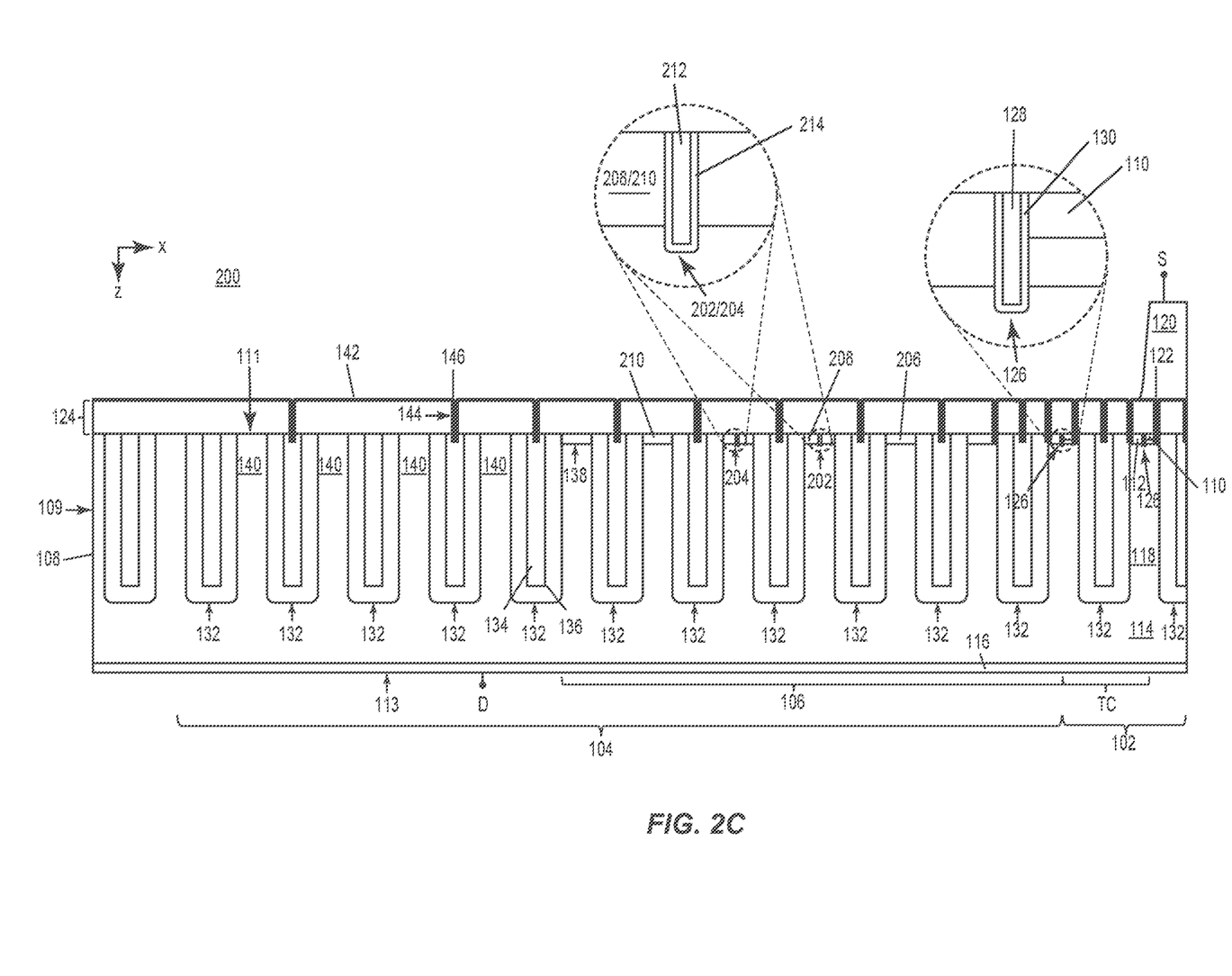
FIG. 2C is a cross-sectional view along the line labelled B-B' in FIG. 2A.

FIGS. 2A through 2C illustrate partial views of another embodiment of a semiconductor device 200 that includes the edge termination structure. FIG. 2A is a partial top plan view of the semiconductor device 200 in a region where the active area 102 of the device 200 adjoins the edge termination area 104 of the device 200. FIG. 2B shows the transition zone 106 of the edge termination area 104 in a corner region of the edge termination area 104. FIG. 2C is a cross-sectional view along the line labelled B-B' in FIG. 2A.

The embodiment illustrated in FIGS. 2A through 2C is similar to the embodiment illustrated in FIGS. 1A through 1C. Different, however, the edge termination area 104 of the semiconductor device 200 includes one or more perimeter trenches 202, 204 that laterally surround the active area, including the gate trench array, and extend deeper into the semiconductor substrate 108 than the body doping region 138. The one or more perimeter trenches 202, 204 physically isolate the body doping region 138 in the edge termination area 104 from the body doping region 138 in the active area 102. Two perimeter trenches 202, 204 are shown in FIG. 2B. However, only one perimeter trench or more than 2 perimeter trenches 202, 204 may be used to physically isolate the body doping region 138 in the edge termination area 104 from the body doping region 138 in the active area 102.

As shown in FIGS. 2B and 2C, the one or more perimeter trenches 202, 204 segment the body doping region 138 into at least two separate body doping regions 206, 208, 210 in the edge termination area 104. As explained above in connection with FIGS. 1A through 1C, each transistor cell TC includes a gate trench 126 with a gate electrode 128 electrically connected to a gate metallization 129. An innermost one 206 of the at least two separate body doping regions 206, 208, 210 is delimited by an outermost one of the gate trenches 126 in the active area 102 and an innermost one of the one or more perimeter trenches in the edge termination area.

The body doping region 138 terminates in the edge termination area 104 before reaching the edge 109 of the semiconductor substrate 108 and the edge termination area 104 may include a doping region 140 of the first conductivity type extending from the body doping region 138 to the edge 109 of the semiconductor substrate 108, as explained above in connection with FIGS. 1A through 1C. According to this embodiment, an outermost one 210 of the at least two separate body doping regions 206, 208, 210 is delimited by an outermost one 204 of the one or more perimeter trenches 202, 204 and the doping region 140 of the first conductivity type. Separately or in combination, each perimeter trench 202, 204 in the edge termination area 104 may have an electrode 212 that is electrically floating and separated from the surrounding semiconductor substrate 108 by an insulating material 214. Each perimeter trench 202, 204 may be concurrently formed with the gate trenches 126 and thus have the same construction as the gate trenches 126. However, when gate contacts are formed to the gate electrodes 128, this process may be blocked in a region of each perimeter trench 202, 204 to ensure each perimeter trench electrode 212 is not electrically connected to gate potential and instead is electrically floating.

Described next with reference to FIGS. 3 through 8 are further embodiments of the needle-shaped compensation trench layout in the edge termination region 104. Each of FIGS. 3 through 8 illustrates a top plan view of a row of needle-shaped compensation trenches 132 in the edge termination area 104.

Figure 3:
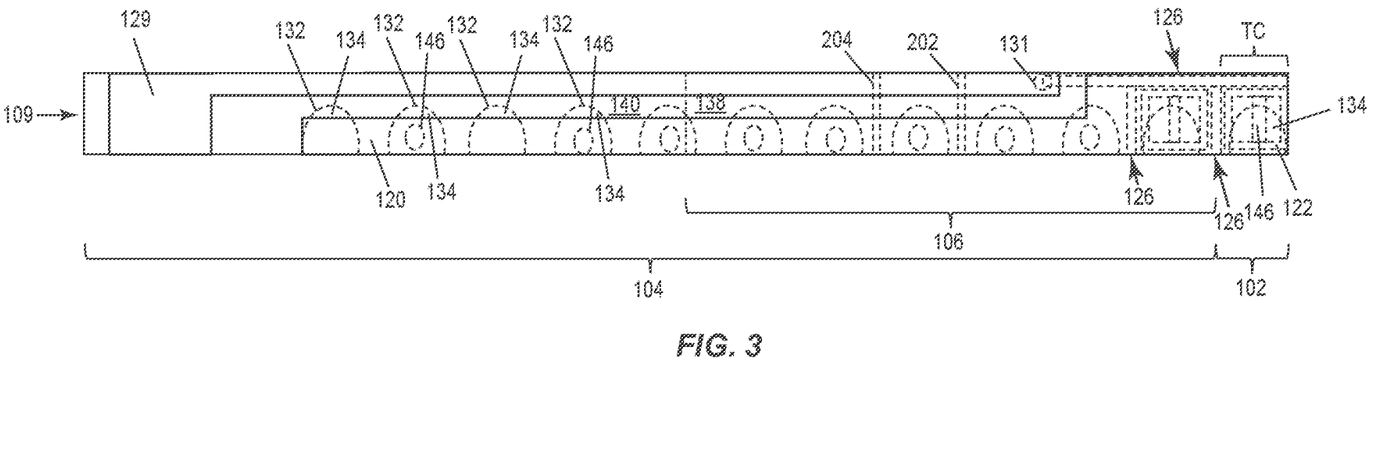
FIGS. 3 through 8 illustrate further embodiments of a needle-shaped compensation trench layout in the edge termination region, where each of FIGS. 3 through 8 illustrates a top plan view of a row of needle-shaped compensation trenches in the edge termination area.

In FIG. 3, at least four needle-shaped compensation trenches 132 are formed in the doping region 140 of the first conductivity type and at least one but not all of the at least four needle-shaped compensation trenches 132 formed in the doping region 140 of the first conductivity type has a field plate 134 that is electrically floating. For example, the field plate contact opening process applied to the interlayer dielectric 124 to form field plate contacts may be masked for these needle-shaped compensation trenches 132. Accordingly, each needle-shaped compensation trench 132 in the edge termination area 104 without a corresponding source metallization contact/via 146 has a field plate 134 that is not electrically connected to the source metallization 120 but instead is electrically floating. In one embodiment, at least the outermost needle-shaped compensation trench 132 formed in the doping region 140 of the first conductivity type and positioned closest to the edge 109 of the semiconductor substrate 108 has a field plate 134 that is electrically floating. The field plate 134 in the second outermost one of the needle-shaped compensation trenches 132 positioned second closest to the edge 109 of the semiconductor substrate 108 may be electrically connected to the source metallization 120, e.g., by the electrically conductive liner 142 shown in FIGS. 1C and 2C. The field plate 134 in the third outermost one of the needle-shaped compensation trenches 132 positioned third closest to the edge 109 of the semiconductor substrate 108 may be electrically floating.

Figure 4:
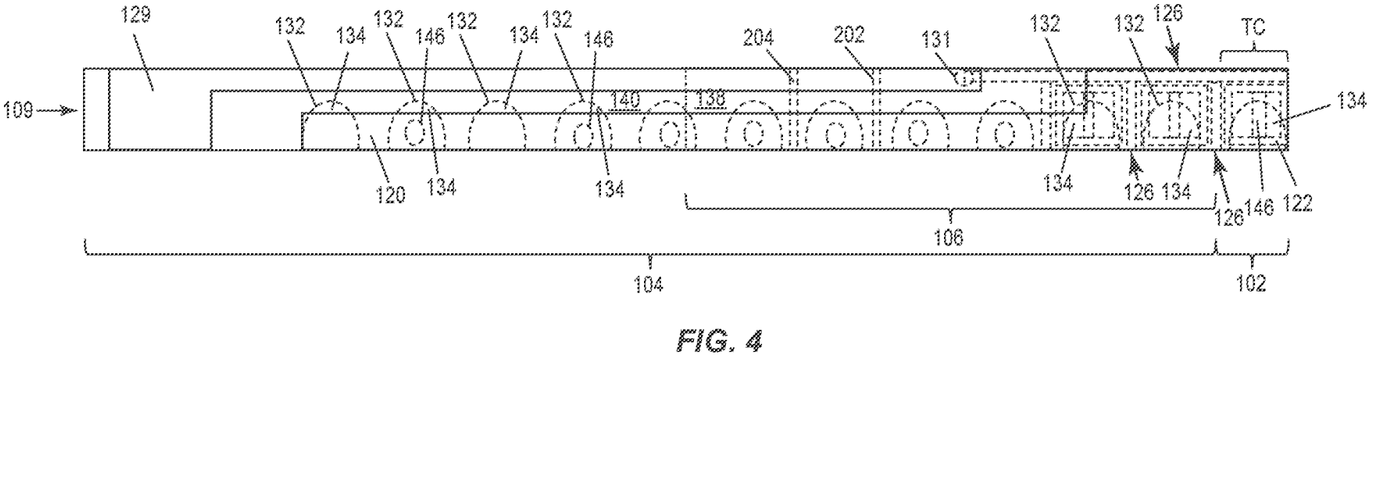

In FIG. 4, at least two innermost ones of the needle-shaped compensation trenches 132 positioned closest to the active area 104 extend through the body doping region 138. According to this embodiment, the field plates 134 in the at least two innermost ones of the needle-shaped compensation trenches 132 included in the edge termination area 104 are electrically connected to the source metallization 120 by respective contacts/vias 146 and the field plate 134 in the outermost one of the needle-shaped compensation trenches 132 positioned closest to the edge 109 of the semiconductor substrate 108 is electrically floating.

Figure 5:
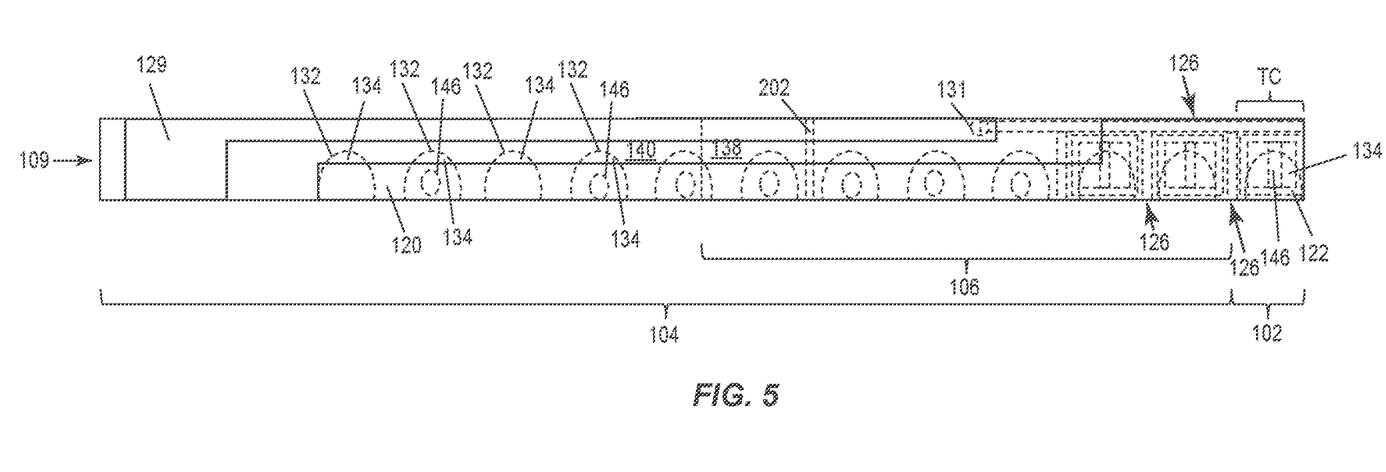

In FIG. 5, a single perimeter trench 202 physically isolates the body doping region 138 in the edge termination area 104 from the body doping region 138 in the active area 102.

Figure 6:
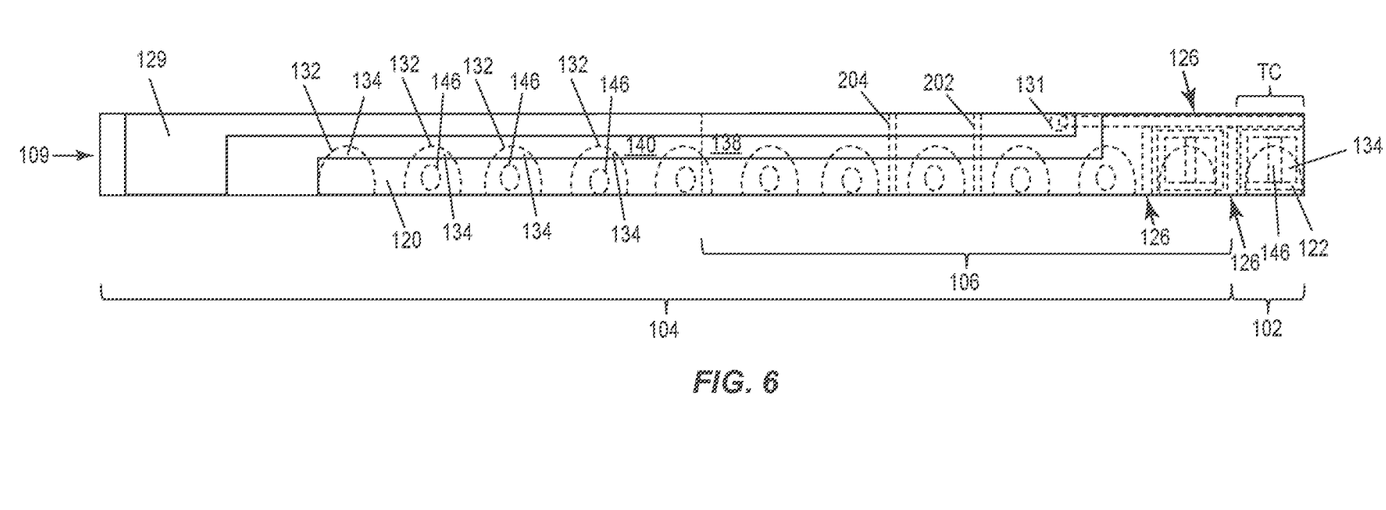

In FIG. 6, only the outermost needle-shaped compensation trench 132 formed in the doping region 140 of the first conductivity type and positioned closest to the edge 109 of the semiconductor substrate 108 has a field plate 134 that is electrically floating.

Figure 7:
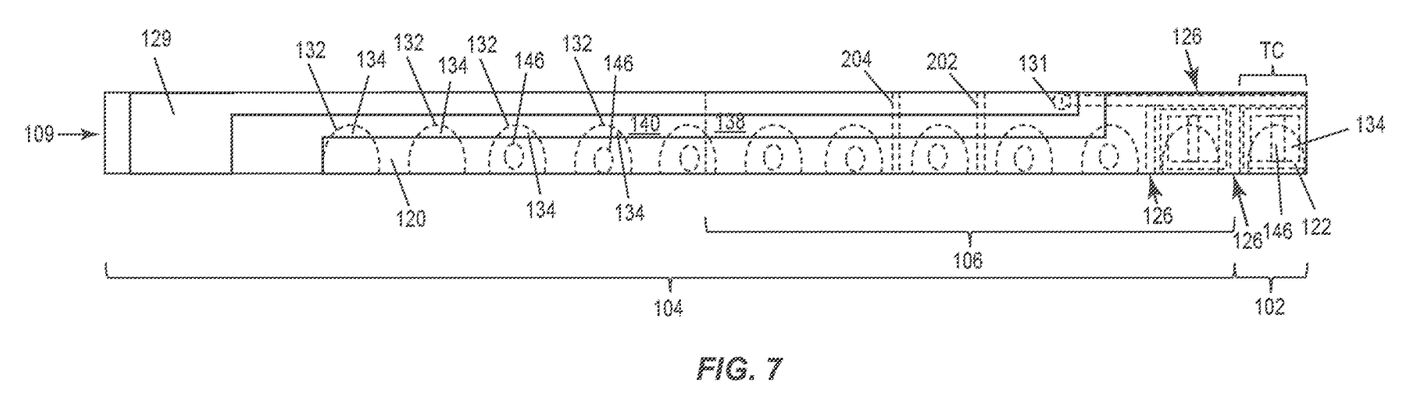

In FIG. 7, only the two outermost needle-shaped compensation trenches 132 formed in the doping region 140 of the first conductivity type and positioned first and second closest, respectively, to the edge 109 of the semiconductor substrate 108 have a field plate 134 that is electrically floating.

Figure 8:
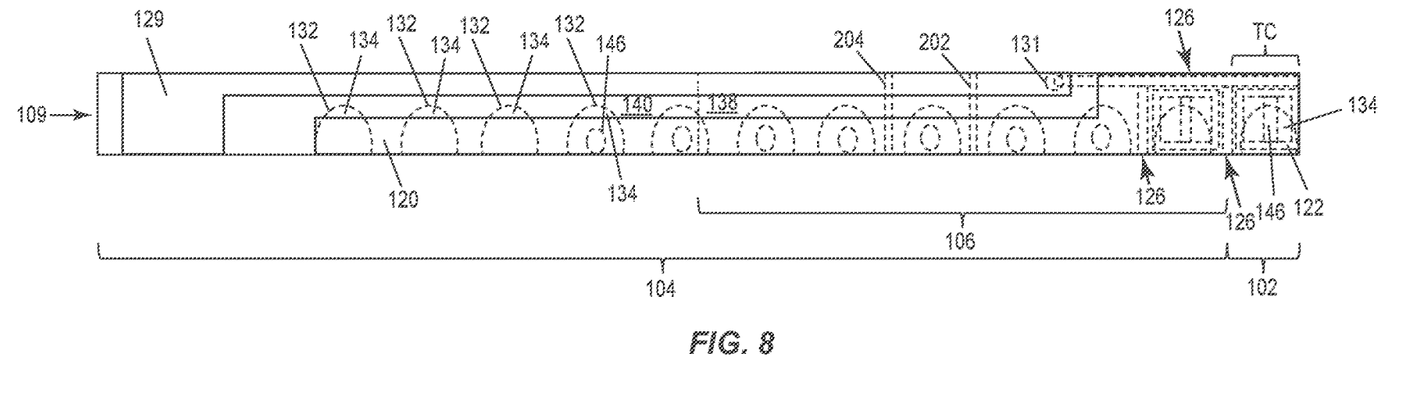

In FIG. 8, only the three outermost needle-shaped compensation trenches 132 formed in the doping region 140 of the first conductivity type and positioned first, second and third closest, respectively, to the edge 109 of the semiconductor substrate 108 have a field plate 134 that is electrically floating.

Any of the embodiments described herein according to which the body doping region 138 in the edge termination area 104 is physically and electrically isolated from the body doping region 138 in the active area 102 may be combined with, or implemented separately from, any of the embodiments described herein according to which at least one needle-shaped compensation trench 132 formed in the doping region 140 of the first conductivity type in the edge termination area 104 has a field plate 134 that is electrically floating.

Although the present disclosure is not so limited, the following numbered examples demonstrate one or more aspects of the disclosure.

Example 1. A semiconductor device, comprising: a semiconductor substrate having an edge, an active area spaced inward from the edge, and an edge termination area laterally surrounding the active area; and a plurality of transistor cells formed in the active area, each transistor cell comprising a source region of a first conductivity type and a body region of a second conductivity type opposite the first conductivity type, wherein the edge termination area comprises a plurality of needle-shaped compensation trenches and is devoid of complete transistor cells, wherein a body doping region of the second conductivity type and that includes the body regions of the transistor cells extends from the active area into the edge termination area, wherein the body doping region in the edge termination area is physically and electrically isolated from the body doping region in the active area.

Example 2. The semiconductor device of example 1, wherein in the active area, the body doping region is electrically connected to a source metallization, and wherein in the edge termination area, the body doping region is electrically floating.

Example 3. The semiconductor device of example 1 or 2, wherein the edge termination area comprises a plurality of stripe-shaped trenches that extend deeper into the semiconductor substrate than the body doping region, and wherein the stripe-shaped trenches physically isolate the body doping region in the edge termination area from the body doping region in the active area.

Example 4. The semiconductor device of any of examples 1 through 3, wherein the edge termination area comprises one or more perimeter trenches that laterally surround the active area and extend deeper into the semiconductor substrate than the body doping region, and wherein the one or more perimeter trenches physically isolate the body doping region in the edge termination area from the body doping region in the active area.

Example 5. The semiconductor device of example 4, wherein the one or more perimeter trenches segment the body doping region into at least two separate body doping regions in the edge termination area.

Example 6. The semiconductor device of example 5, wherein each transistor cell comprises a gate trench with a gate electrode electrically connected to a gate metallization, and wherein an innermost one of the at least two separate body doping regions is delimited by an outermost one of the gate trenches in the active area and an innermost one of the one or more perimeter trenches in the edge termination area.

Example 7. The semiconductor device of example 5 or 6, wherein the body doping region terminates in the edge termination area before reaching the edge of the semiconductor substrate, wherein the edge termination area comprises a doping region of the first conductivity type extending from the body doping region to the edge of the semiconductor substrate, and wherein an outermost one of the at least two separate body doping regions is delimited by an outermost one of the one or more perimeter trenches and the doping region of the first conductivity type.

Example 8. The semiconductor device of any of examples 4 through 7, wherein each perimeter trench in the edge termination area has an electrode that is electrically floating.

Example 9. The semiconductor device of any of examples 1 through 8, wherein the edge termination area comprises a doping region of the first conductivity type extending from the body doping region to the edge of the semiconductor substrate, and wherein at least one of the needle-shaped compensation trenches is formed in the doping region of the first conductivity type and has a field plate that is electrically floating.

Example 10. The semiconductor device of any of examples 1 through 9, wherein the edge termination area comprises a doping region of the first conductivity type extending from the body doping region to the edge of the semiconductor substrate, wherein at least four of the needle-shaped compensation trenches are formed in the doping region of the first conductivity type, and wherein at least one but not all of the at least four needle-shaped compensation trenches formed in the doping region of the first conductivity type has a field plate that is electrically floating.

Example 11. The semiconductor device of example 10, wherein an outermost one of the at least four needle-shaped compensation trenches formed in the doping region of the first conductivity type and positioned closest to the edge of the semiconductor substrate has a field plate that is electrically floating.

Example 12. The semiconductor device of any of examples 1 through 11, wherein at least two innermost ones of the needle-shaped compensation trenches positioned closest to the active area extend through the body doping region.

Example 13. The semiconductor device of example 12, wherein the source regions and the body regions of the transistor cells are electrically connected to a source metallization, wherein each needle-shaped compensation trench in the edge termination area has a field plate, and wherein the field plates in the at least two innermost ones of the needle-shaped compensation trenches are electrically connected to the source metallization.

Example 14. The semiconductor device of example 13, wherein the field plate in an outermost one of the needle-shaped compensation trenches positioned closest to the edge of the semiconductor substrate is electrically floating.

Example 15. The semiconductor device of example 14, wherein the field plate in a second outermost one of the needle-shaped compensation trenches positioned second closest to the edge of the semiconductor substrate is electrically connected to the source metallization.

Example 16. The semiconductor device of example 15, wherein the field plate in a third outermost one of the needle-shaped compensation trenches positioned third closest to the edge of the semiconductor substrate is electrically floating.

Example 17. A semiconductor device, comprising: a semiconductor substrate having an edge, an active area spaced inward from the edge, and an edge termination area laterally surrounding the active area; and a plurality of transistor cells formed in the active area, each transistor cell comprising a source region of a first conductivity type and a body region of a second conductivity type opposite the first conductivity type, wherein the edge termination area comprises a plurality of needle-shaped compensation trenches and is devoid of complete transistor cells, wherein a body doping region of the second conductivity type and that includes the body regions of the transistor cells extends from the active area into the edge termination area, wherein the edge termination area comprises a doping region of the first conductivity type extending from the body doping region to the edge of the semiconductor substrate, wherein at least one of the needle-shaped compensation trenches is formed in the doping region of the first conductivity type and has a field plate that is electrically floating.

Example 18. The semiconductor device of example 17, wherein at least four of the needle-shaped compensation trenches are formed in the doping region of the first conductivity type, and wherein at least one but not all of the at least four needle-shaped compensation trenches formed in the doping region of the first conductivity type has a field plate that is electrically floating.

Example 19. The semiconductor device of example 18, wherein an outermost one of the at least four needle-shaped compensation trenches formed in the doping region of the first conductivity type and positioned closest to the edge of the semiconductor substrate has a field plate that is electrically floating.

Example 20. The semiconductor device of example 19, wherein a second outermost one of the at least four needle-shaped compensation trenches formed in the doping region of the first conductivity type and positioned second closest to the edge of the semiconductor substrate has a field electrode that is electrically connected to a source metallization.

Example 21. The semiconductor device of example 20, wherein a third outermost one of the at least four needle-shaped compensation trenches formed in the doping region of the first conductivity type and positioned closest to the edge of the semiconductor substrate has a field electrode that is electrically floating.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate having an edge, an active area spaced inward from the edge, and an edge termination area laterally surrounding the active area; and
    a plurality of transistor cells formed in the active area, each transistor cell comprising a source region of a first conductivity type and a body region of a second conductivity type opposite the first conductivity type,
    wherein the edge termination area comprises one or more perimeter trenches,
    wherein the edge termination area comprises a plurality of needle-shaped compensation trenches and is devoid of complete transistor cells,
    wherein a body doping region of the second conductivity type and that includes the body regions of the transistor cells extends from the active area into the edge termination area,
    wherein the body doping region in the edge termination area is physically and electrically isolated from the body doping region in the active area,
    wherein the one or more perimeter trenches segment the body doping region into at least two separate body doping regions arranged between two compensation trenches of the plurality of needle-shaped compensation trenches within the edge termination area,
    wherein the one or more perimeter trenches laterally surround the active area.

2. The semiconductor device of claim 1, wherein in the active area, the body doping region is electrically connected to a source metallization, and wherein in the edge termination area, the body doping region is electrically floating.

3. The semiconductor device of claim 1, wherein the edge termination area comprises a plurality of stripe-shaped trenches that intersect, and wherein the stripe-shaped trenches that intersect in an outermost area of a transition zone of the edge termination area extend deeper into the semiconductor substrate than the body doping region, and wherein the stripe-shaped trenches physically isolate the body doping region in the edge termination area from the body doping region in the active area.

4. The semiconductor device of claim 1, wherein the one or more perimeter trenches extend deeper into the semiconductor substrate than the body doping region, and wherein the one or more perimeter trenches physically isolate the body doping region in the edge termination area from the body doping region in the active area.

5. The semiconductor device of claim 4, wherein each transistor cell comprises a gate trench with a gate electrode electrically connected to a gate metallization, and wherein an innermost one of the at least two separate body doping regions is delimited by an outermost one of the gate trenches in the active area and an innermost one of the one or more perimeter trenches in the edge termination area.

6. The semiconductor device of claim 4, wherein the body doping region terminates in the edge termination area before reaching the edge of the semiconductor substrate, wherein the edge termination area comprises a doping region of the first conductivity type extending from the body doping region to the edge of the semiconductor substrate, and wherein an outermost one of the at least two separate body doping regions is delimited by an outermost one of the one or more perimeter trenches and the doping region of the first conductivity type.

7. The semiconductor device of claim 4, wherein each perimeter trench in the edge termination area has an electrode that is electrically floating.

8. The semiconductor device of claim 1, wherein the edge termination area comprises a doping region of the first conductivity type extending from the body doping region to the edge of the semiconductor substrate, and wherein at least one of the needle-shaped compensation trenches is formed in the doping region of the first conductivity type and has a field plate that is electrically floating.

9. The semiconductor device of claim 1, wherein the edge termination area comprises a doping region of the first conductivity type extending from the body doping region to the edge of the semiconductor substrate, wherein at least four of the needle-shaped compensation trenches are formed in the doping region of the first conductivity type, and wherein at least one but not all of the at least four needle-shaped compensation trenches formed in the doping region of the first conductivity type has a field plate that is electrically floating.

10. The semiconductor device of claim 9, wherein an outermost one of the at least four needle-shaped compensation trenches formed in the doping region of the first conductivity type and positioned closest to the edge of the semiconductor substrate has a field plate that is electrically floating.

11. The semiconductor device of claim 1, wherein at least two innermost ones of the needle-shaped compensation trenches positioned closest to the active area extend through the body doping region.

12. The semiconductor device of claim 11, wherein the source regions and the body regions of the transistor cells are electrically connected to a source metallization, wherein each needle-shaped compensation trench in the edge termination area has a field plate, and wherein the field plates in the at least two innermost ones of the needle-shaped compensation trenches are electrically connected to the source metallization.

13. The semiconductor device of claim 12, wherein the field plate in an outermost one of the needle-shaped compensation trenches positioned closest to the edge of the semiconductor substrate is electrically floating.

14. The semiconductor device of claim 13, wherein the field plate in a second outermost one of the needle-shaped compensation trenches positioned second closest to the edge of the semiconductor substrate is electrically connected to the source metallization.

15. The semiconductor device of claim 14, wherein the field plate in a third outermost one of the needle-shaped compensation trenches positioned third closest to the edge of the semiconductor substrate is electrically floating.

16. A semiconductor device, comprising:
a semiconductor substrate having an edge, an active area spaced inward from the edge, and an edge termination area laterally surrounding the active area; and
a plurality of transistor cells formed in the active area, each transistor cell comprising a source region of a first conductivity type and a body region of a second conductivity type opposite the first conductivity type,
wherein the edge termination area comprises one or more perimeter trenches,
wherein the edge termination area comprises a plurality of needle-shaped compensation trenches and is devoid of complete transistor cells,
wherein a body doping region of the second conductivity type and that includes the body regions of the transistor cells extends from the active area into the edge termination area,
wherein the edge termination area comprises a doping region of the first conductivity type extending from the body doping region to the edge of the semiconductor substrate,
wherein at least one of the needle-shaped compensation trenches is formed in the doping region of the first conductivity type and has a field plate that is electrically floating,
wherein the one or more perimeter trenches segment the body doping region into at least two separate body doping regions arranged between two compensation trenches of the plurality of needle-shaped compensation trenches within the edge termination area,
wherein the one or more perimeter trenches laterally surround the active area.

17. The semiconductor device of claim 16, wherein at least four of the needle-shaped compensation trenches are formed in the doping region of the first conductivity type, and wherein at least one but not all of the at least four needle-shaped compensation trenches formed in the doping region of the first conductivity type has a field plate that is electrically floating.

18. The semiconductor device of claim 17, wherein an outermost one of the at least four needle-shaped compensation trenches formed in the doping region of the first conductivity type and positioned closest to the edge of the semiconductor substrate has a field plate that is electrically floating.

19. The semiconductor device of claim 18, wherein a second outermost one of the at least four needle-shaped compensation trenches formed in the doping region of the first conductivity type and positioned second closest to the edge of the semiconductor substrate has a field electrode that is electrically connected to a source metallization.

20. The semiconductor device of claim 19, wherein a third outermost one of the at least four needle-shaped compensation trenches formed in the doping region of the first conductivity type and positioned third closest to the edge of the semiconductor substrate has a field electrode that is electrically floating.

21. The semiconductor device of claim 16, wherein the edge termination area comprises a plurality of stripe-shaped gate trenches that intersect, and wherein stripe-shaped gate trenches that intersect in an outermost area of a transition zone of the edge termination area extend deeper into the semiconductor substrate than the body doping region, and wherein the stripe-shaped gate trenches physically isolate the body doping region in the edge termination area from the body doping region in the active area.

* * * * *